United States Patent [19]
Bickmann et al.

[11] Patent Number: 5,670,065
[45] Date of Patent: Sep. 23, 1997

[54] APPARATUS FOR PLASMA TREATMENT OF FINE GRAINED MATERIALS

[75] Inventors: Herrmann Bickmann, Ditzingen; Klaus Nauenburg, Tübingen; Juergen Weichart, Filderstadt, all of Germany

[73] Assignee: Buck Werke GmbH & Co., Germany

[21] Appl. No.: 498,437

[22] Filed: Jul. 5, 1995

[30] Foreign Application Priority Data

Jul. 5, 1994 [DE] Germany ............ 44 23 471.6

[51] Int. Cl.$^6$ .................................................. B23K 10/00
[52] U.S. Cl. ............................ 219/121.43; 219/121.58; 219/121.59; 219/121.36; 219/700; 414/218
[58] Field of Search .................... 219/121.58, 121.43, 219/121.44, 121.36, 121.52, 121.59, 700, 654; 414/217, 218, 416

[56] References Cited

U.S. PATENT DOCUMENTS

| | | | |
|---|---|---|---|
| 4,423,303 | 12/1983 | Hirose et al. | 219/121 P |
| 4,608,261 | 8/1986 | Mackenzie | 426/242 |
| 4,859,493 | 8/1989 | Lemelson | 118/730 |
| 5,283,119 | 2/1994 | Shuttleworth et al. | 428/375 |
| 5,328,515 | 7/1994 | Chovan et al. | 118/723 ME |
| 5,409,543 | 4/1995 | Panitz et al. | 219/85.1 |
| 5,425,611 | 6/1995 | Hughes et al. | 414/217 |

FOREIGN PATENT DOCUMENTS

A-1 41 41 805   6/1993   Germany.

OTHER PUBLICATIONS

English language Abstract of DE-A-1 41 41 805 from Derwent WPI database. Acc No. 93-206131/26.

Primary Examiner—Mark H. Paschall
Attorney, Agent, or Firm—Hill, Steadman & Simpson

[57] ABSTRACT

"An apparatus for plasma treating fine-grained materials, having a receptacle that can be evacuated and that accepts and agitates the materials to be treated, and having an electromagnetic device that comprises an excitation device and electrodes and to activate a process gas filling the space of the receptacle means to form a plasma, wherein the receptacle has a conveyor which conveys the material from one end to another end and is configured for continuous admission and discharge of the material and admission and discharge of the process gas, but that is otherwise hermetically closed, and at which or in which the electromagnetic excitation device that effects the plasma formation within the conveyor is arranged."

18 Claims, 2 Drawing Sheets

APPARATUS FOR PLASMA TREATMENT OF FINE GRAINED MATERIALS

BACKGROUND OF THE INVENTION

The present invention is directed to an apparatus for plasma treatment of fine-grained materials, particularly powders, comprising a receptacle means that accepts and agitates the material to be treated and an electromagnetic means comprising an excitation means and electrodes, applied to a gas that fills the space of the receptacle means to form a plasma.

This apparatus, which is discussed by German Patent No. DE 41 41 805 A1, incorporated herein by reference, must be charged in a batch mode, i.e., a work sequence of "loading—evacuating—treating—aerating—unloading" must be performed. However, this limits the treatment capacity of this apparatus.

U.S. Pat. No. 4,423,303, incorporated herein by reference, also discloses an apparatus wherein, without interrupting the treatment process, it is possible to treat a larger quantity of fine-grained material than that quantity that can be directly introduced into the treatment space.

To this end, the material to be treated is made available from an external reservoir and material that has already been treated is transferred from the treatment space into a container. The reservoir and container are part of the system evacuated for the treatment process. When filling the reservoir and, particularly, when emptying the container for the material that has already been treated, the treatment space must be aerated and, thus, the treatment process must be interrupted. The no-load time that thereby necessarily occurs at regular intervals reduces the desired, high throughput of the material to be treated.

SUMMARY OF THE INVENTION

It is an object of the present invention to provide an apparatus for plasma treatment of fine-grained materials that permits a high throughput of the material to be treated.

To that end, in an embodiment, the invention provides that a receptacle is configured as a conveyor path that is provided with means allowing for continuous admission and discharge of the material and admission and discharge of the plasma gas but that is otherwise hermetically closed and at which or in which the electromagnetic excitation or activation means effecting the plasma creation in the conveyor path is arranged.

The conveyor path can thereby be configured as an oscillating conveyor chute, as a screw conveyor or, on the other hand, as a rotary tube.

In a preferred embodiment, the invention provides that the area that covers the conveyor path toward a top thereof is composed of a dielectric material and the excitation means is positioned outside the conveyor path but is configured to effect the plasma ignition in the conveyor path through the dielectric material.

Alternatively, the electrodes of the excitation means can be arranged within the conveyor path, i.e., within the receptacle.

The excitation or activation of the process gas can be effected by suitable application of any combination of a high-frequency, low-frequency and/or microwave irradiation, i.e., microwave, high frequency and/or low frequency electromagnetic signals.

These and other features of the invention are discussed in greater detail below in the following detailed description of the presently preferred embodiments with reference to the accompanying drawings.

DETAILED DESCRIPTION OF THE PRESENTLY PREFERRED EMBODIMENTS

At least three exemplary embodiments of the invention are illustrated in the Figures.

Figure 1:
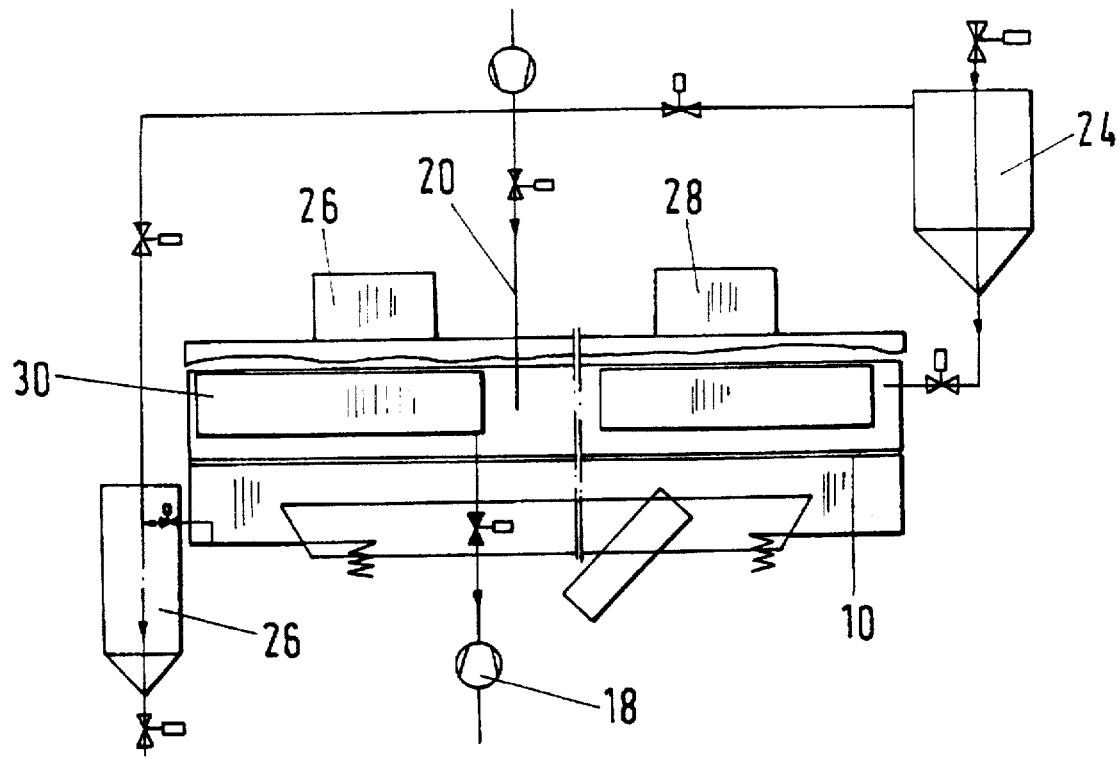
FIG. 1 illustrates an embodiment of the invention utilizing an oscillating conveyor chute.
Figure 2:
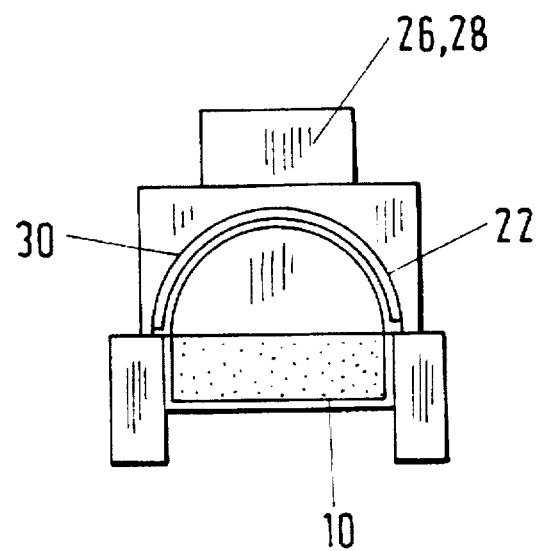
FIG. 2 is a sectional view of the embodiment of FIG. 1.

In the exemplary embodiment shown in FIG. 1, a conveyor path is comprised of an oscillating conveyor chute 10 that is provided with a dome or covering 22, which itself is composed of a dielectric material, for example quartz, glass or aluminum oxide. The material to be treated is introduced into the oscillating conveyor chute 10 via a first vacuum sluice 24 and moves therein in the direction toward a second vacuum sluice 26.

As illustrated, high-frequency sources 27 and 28 are arranged above the dielectric dome 22 (and, thus, outside the oscillating conveyor chute 10), these high-frequency sources beaming energy into the conveyor chute through the dielectric dome 22 via a half-shell electrode 30 to ignite the plasma therein.

A suitable vacuum means or pump 18 permits the evacuation of the process chamber and permits the introduction of the process gas. The gas delivery and extraction are undertaken via these devices in a known way.

The material to be treated is simultaneously moved by micro-throws generated in the oscillating conveyor chute 10 and the trajectory of the medium allows a good current linkage of plasma and gas. The vacuum sluices 24 and 26 arranged, respectively, at the start and at the end of the oscillating conveyor chute 10 allow for a continuous execution of the production process. Rotating disks (not shown in this exemplary embodiment) can thereby be provided that assume the functions of filling, emptying, evacuating and gas delivery.

The material to be treated can be moved back and forth or, on the other hand, faster and slower by varying the vibrations in horizontal, vertical or rotary directions.

The plasma ignition can be undertaken not only with a high-frequency excitation or activation but can also be undertaken with a low-frequency alternating current generator (for example, a Khz source) or even with a microwave excitation. The electrode for that purpose can be located in the plasma gas reactor and can be connected to the corresponding excitation apparatus via a flexible conduit. High-frequency and low-frequency can also be simultaneously supplied in this way.

The system length can be matched to correspond to the local conditions, i.e., the particular application of concern.

An emptying of the chute an also be undertaken by appropriate suctioning.

The drying process can be supported by appropriate heating of the chute.

Figure 3:
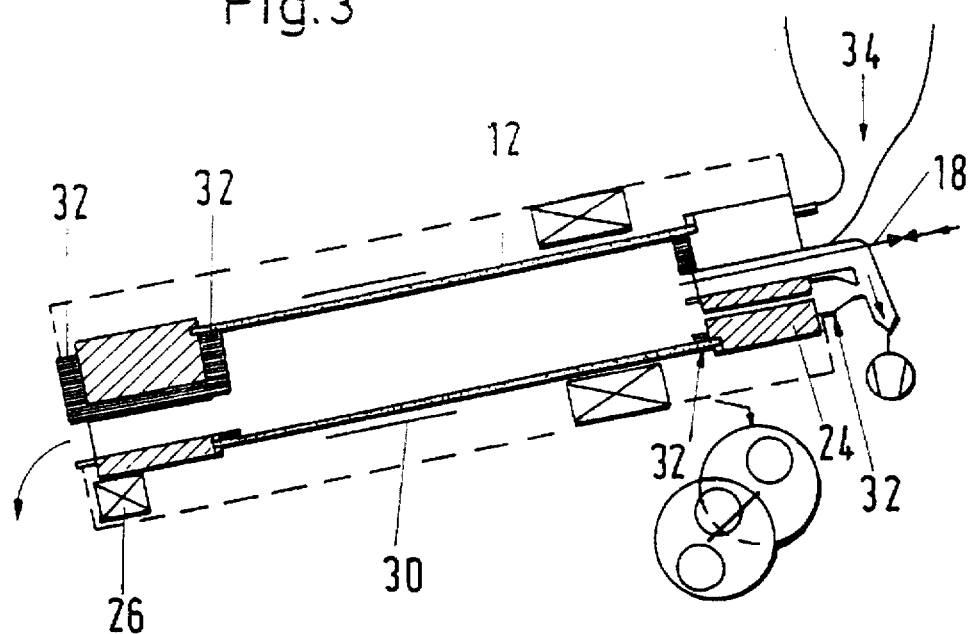
FIG. 3 illustrates an embodiment of the invention utilizing a rotary tube.

In the exemplary embodiment shown in FIG. 3, the conveyor path is comprised of a rotary tube 12 made of dielectric material. There is provided a rotating vacuum sluice 24 for intake of material to be treated and a rotating, and a further vacuum sluice 26 for outward transfer of the treated material. The admission of the process gas is effected via an appropriate means or mechanism 18, such as those described in he previusly mentioned prior art patents incorporated herein by reference.

The material to be treated is introduced into the rotary tube 12 from a reservoir 34 through the admission sluice 24 and, after passing through the obliquely arranged rotary tube 12, is discharged at the opposite, lower end.

High-frequency electrodes 30 are used to capacitatively infeed the energy that effects the ignition of the process gas.

Similar to the cylinder of a revolver, the vacuum sluice 24—which is rotatable around an axis lying parallel to the conveying direction—comprises a plurality of chambers, for example six chambers, that extend parallel to said axis and that are closed both toward the atmosphere side as well as toward the vacuum side by stationary disks or diaphragms 32.

The disk 32 arranged at the atmosphere side comprises two circular openings that enable a connection to a reservoir 34 and to a vacuum pump. The disk 32 arranged at the vacuum side comprises only one circular opening that enables a connection to the treatment chamber within the rotary tube 12 composed of a dielectric material.

The individual chambers of the vacuum sluice 24 can thus either be hermetically closed or opened up via one of the circular openings of the disks 32 to the reservoir 34, to a vacuum pump or toward the treatment chamber.

For filling, one of the chambers is then brought into a position that is open toward the reservoir 34. It can then be filled with bulk material. When turning the sluice chamber 24, this chamber is hermetically sealed off by the two disks 32—at least for a short time. As a result of further turning, for example turning by 60°, this chamber opens up toward a pump flange and the gas space in the chamber around the bulk material is evacuated. As a result of continued turning of the sluice 24, the chamber is again hermetically sealed off and then opens up toward the treatment chamber, so that the bulk material is transferred thereinto without causing a rise in pressure in the treatment space.

As the sluice is turned farther, the chamber is hermetically sealed off and then, ultimately, opens up again toward the reservoir so that the procedure set forth above begins again.

A plurality of such chambers are provided in the "revolver sluice" and their plurality and size can be matched to the applicable requirements of a given installation. A continuous filling of the treatment chamber is thus enabled, whereby, in particular, no interruptions in the treatment are necessary in order to fill up the reservoir 34.

The outward transfer of the workpieces or goods, i.e., treated material, from the treatment chamber ensues through a correspondingly constructed sluice 26. The treatment chamber is always in an evacuated condition.

The delivery of the process gas occurs continuously via an appropriate mechanism 18. However, it can also be effected via the individual chambers of the vacuum sluice 24. In this case, the disk arranged at the atmosphere side comprises an additional, third opening through which the process gas is introduced into the chambers of the vacuum sluice after evacuation and before the chambers are opened toward the treatment space.

Figure 4:
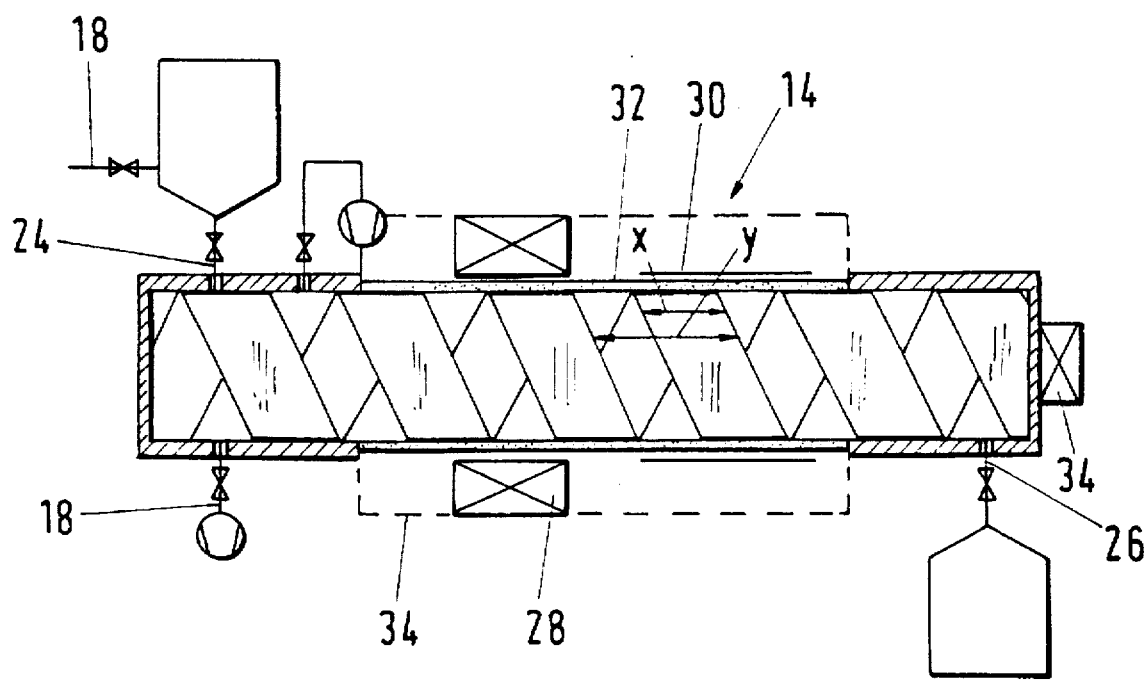
FIG. 4 illustrates an embodiment of the invention utilizing a screw conveyor.

In the exemplary embodiment shown in FIG. 4, the conveyor path is configured as a screw conveyor 14. The height of the resulting land of the screw is identified by the reference character as x and the width of the root face or pitch of the screw is identified by the reference character as y. The screw is driven via a screw drive 34.

The pipe 32 of the screw conveyor is composed of a dielectric material, such as one of those mentioned previously. A shielding and a carrier 34 for the device 28 for generating microwaves are arranged under the pipe.

The material to be treated is introduced via a vacuum sluice 24 and is in turn discharged from the screw conveyor 14 via a vacuum sluice 26. A vacuum pump 18 permits an evacuation of the process chamber.

High-frequency electrodes 30 are arranged around the screw conveyor. The process gas is introduced into the screw conveyor through the vacuum sluice 24 via a suitable infeed 18. The admission of the bulk material occurs only during a time x/y established by the screw geometry. The screw conveys the bulk material in the pipe 32 while microwave energy is introduced thereinto from the outside through the wall of the pipe. Alternatively (but also additively as well), high-frequency can be supplied from the outside with a combination of silica glass sections t which radio frequency (for example, 13.56 Mhz) and microwave energy is delivered.

Alternatively, however, the screw can also be introduced at the inside wall of the pipe, whereby a magnetron for microwave infeed and/or an electrode are then arranged on the middle axis of the pipe (this exemplary embodiment is not shown in the drawing). The magnetron can also be introduced from one side and the electrode can be introduced from the other side. Further variations wherein windows are applied at the pipe jacket and through which the microwave or radio frequency are supplied as possible.

Although modifications and changes may be suggested by those skilled in the art, it is the intention of the inventors to embody within the patent warranted hereon all changes and modifications as reasonably and properly come within the scope of their contribution to the art.

We claim:

1. An apparatus for plasma treating fine-grained materials, comprising:

a receptacle that can be evacuated and that accepts and agitates fine-grained material to be treated under hermetically sealed conditions, the receptacle including a conveyor which conveys the material from one end of the receptacle to another end of the receptacle;

means for continuously admitting the material into the receptacle;

means for continuously discharging treated material from the receptacle;

means for admitting process gas into the receptacle;

means for discharging process gas from the receptacle; and electromagnetic means for igniting a plasma gas to form a plasma, the electromagnetic means comprising excitation means and electrodes, the excitation means being postioned along the conveyor.

2. The apparatus of claim 1, wherein the conveyor is an oscillating conveyor chute.

3. The apparatus of claim 1, wherein the conveyor is a rotary tube.

4. The apparatus of claim 1, wherein the conveyor is a screw conveyor.

5. The apparatus of claim 1, wherein a region that covers the conveyor toward a top thereof is composed of a dielectric material and the excitation means is positioned outside of the conveyor such that plasma ignition in the conveyor path is effected through the dielectric material.

6. The apparatus of any of claims 1–5, wherein the electrodes of the excitation means are positioned within the conveyor.

7. The apparatus of claim 1, wherein the ignition of the process gas is effected with any combination of a microwave signal, a signal with a frequency in the kilohertz range, and a signal in the megahertz range.

8. The apparatus of claim 1, wherein the means for continuously admitting fine-grained material into the receptacle comprises a rotary tube surrounding the receptacle with a plurality of chambers therein extending parallel to an axis of the receptacle, which chambers rotate about the receptacle, each chamber rotating through a first position at which the chamber is in communication only with a reservoir of the fine-grained material, and a second position at which the chamber is in communication only with the receptacle.

9. The apparatus of claim 1, wherein the means for discharging treated material from the receptacle comprises a rotary member with a plurality of chambers therein, each chamber rotating through a first position at which the chamber is in communication only with a discharge opening for the treated material, and a second position at which the chamber is in communication only with the receptacle.

10. An apparatus for plasma treating fine-grained materials, comprising:

a receptacle that accepts and agitates material to be treated, the receptacle being constructed such that the material can be hermetically sealed therein and to have a conveyor which conveys the material from one end of the receptacle to another end;

electromagnetic means for igniting a process gas within the receptacle to form a plasma, the electromagnetic means including excitation means for generating a suitable plasma igniting electromagnetic signal and electrodes for transmitting the signals from the excitation means to the process gas; and means for continuously admitting the material into the receptacle while maintaining the hermetic seal; and means for continuously discharging the treated material from the receptacle while maintaining the hermetic seal.

11. The apparatus of claim 10, wherein the conveyor is an oscillating conveyor chute.

12. The apparatus of claim 10, wherein the conveyor is a rotary tube.

13. The apparatus of claim 10, wherein the conveyor is a screw conveyor.

14. The apparatus of claim 10, wherein a region that covers the conveyor toward a top thereof is composed of a dielectric material and the excitation means is positioned outside of the conveyor such that plasma ignition in the conveyor path is effected through the dielectric material.

15. The apparatus of any of claims 10–14, wherein the electrodes of the excitation means are positioned within the conveyor.

16. The apparatus of claim 10, wherein the ignition of the process gas is effected with any combination of a microwave signal, a signal with a frequency in the kilohertz range, and a signal in the megahertz range.

17. The apparatus of claim 10, wherein the means for continuously admitting fine-grained material into the receptacle comprises a rotary tube surrounding the receptacle with a plurality of chambers therein extending parallel to an axis of the receptacle, which chambers rotate about the receptacle, each chamber rotating through a first position at which the chamber is in communication only with a reservoir of the fine-grained material, and a second position at which the chamber is in communication only with the receptacle.

18. The apparatus of claim 10, wherein the means for discharging treated material from the receptacle comprises a rotary member with a plurality of chambers therein, each chamber rotating through a first position at which the chamber is in communication only with a discharge opening for the treated material, and a second position at which the chamber is in communication only with the receptacle.

* * * * *